(12) United States Patent
Shibahara et al.

(10) Patent No.: US 7,138,838 B2
(45) Date of Patent: Nov. 21, 2006

(54) PHASE LOCKED LOOP

(75) Inventors: Yoshiyuki Shibahara, Tokyo (JP); Masaru Kokubo, Hanno (JP); Takashi Oshima, Saitama (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/765,129

(22) Filed: Jan. 28, 2004

(65) Prior Publication Data
US 2004/0207437 A1    Oct. 21, 2004

(30) Foreign Application Priority Data
Jan. 29, 2003   (JP) .............................. 2003-020459

(51) Int. Cl.
*H03L 7/06* (2006.01)

(52) U.S. Cl. ...................................... 327/157; 375/374

(58) Field of Classification Search ........ 327/147–150, 327/156–159; 332/127–128, 117, 106, 112; 375/239, 240, 362, 373–376
See application file for complete search history.

(56) References Cited

U.S. PATENT DOCUMENTS

| | | | |
|---|---|---|---|
| 4,755,774 A * | 7/1988 | Heck ........................... | 332/123 |
| 5,834,987 A * | 11/1998 | Dent ........................... | 332/127 |
| 6,515,553 B1 * | 2/2003 | Filiol et al. .................. | 332/127 |
| 6,600,378 B1 * | 7/2003 | Patana ......................... | 331/1 A |
| 6,605,935 B1 * | 8/2003 | Nilsson .................... | 324/76.53 |
| 6,606,005 B1 * | 8/2003 | Chang .......................... | 331/78 |
| 6,693,494 B1 * | 2/2004 | Fan .............................. | 331/17 |
| 6,700,447 B1 * | 3/2004 | Nilsson ........................ | 331/10 |
| 6,707,855 B1 * | 3/2004 | Patana ......................... | 375/244 |

FOREIGN PATENT DOCUMENTS

| | | |
|---|---|---|
| JP | 2002-271213 | 3/2001 |
| JP | 2002-314356 | 4/2001 |
| JP | 2002-353740 | 5/2001 |
| JP | 2003-017985 | 6/2001 |

OTHER PUBLICATIONS

Seong Hwan Cho et al., "A 6.5GHz CMOS FSK Modulator for Wireless Sensor Applications", 2002 Symposium on VLSI Circuits Digest of Technical Papers, pp. 182-185.

Michael H. Perrott, "A 27-mW CMOS Fractional-$N$ Synthesizer Using Digital Compensation for 2.5-Mb/s GFSK Modulation", IEEE Journal of Solid-State Circuits, vol. 32, No. 12, Dec. 1997, pp. 2048-2060.

Benzad Razavi, "RF Microelectronics", 1998, Prentice Hall, pp. 278-283.

* cited by examiner

*Primary Examiner*—Timothy P. Callahan
*Assistant Examiner*—Cassandra Cox
(74) *Attorney, Agent, or Firm*—Reed Smith LLP; Stanley P. Fisher, Esq.; Juan Carlos A. Marquez, Esq.

(57) ABSTRACT

A variable loop bandwidth phase locked loop in which, upon input of a succession of signals "1", no modulated signal degradation occurs and even at a high symbol rate, the reference signal frequency remains low and the sampling frequencies of a phase-frequency detector and a sigma delta circuit remain low. The phase locked loop comprises: a first modulator which transforms baseband signal TX_DATA into an integer signal for specifying a division number and sends it to a control terminal of a programmable divider; a second modulator which shapes an incoming baseband signal into a prescribed signal waveform and sends it to a voltage controlled oscillator; and a variable current charge pump which changes the loop bandwidth of the phase locked loop according to control signal CUR.

19 Claims, 13 Drawing Sheets

US 7,138,838 B2

PHASE LOCKED LOOP

PRIORITY CLAIM

This application claims priority under 35 U.S.C. §119 to Japanese patent application P2003-20459 filed Jan. 29, 2003 the entire disclosure of which is hereby incorporated herein by reference.

FIELD OF THE INVENTION

The present invention relates to phase locked loop (PLL) circuits which transmit signals, and more particularly to phase locked loop circuits which change the loop bandwidth according to control signals.

BACKGROUND OF THE INVENTION

A first example of a conventional phase locked loop for transmission of signals is illustrated in FIG. 1. This phase locked loop has a phase-frequency detector 1 (PFD), a charge pump 2 (CP), a loop filter 3 (LF), a voltage controlled oscillator 4 (VCO), a programmable divider 5, a pulse shaping circuit 6 (PSC), and a sigma delta circuit 7 (ΔΣ). The phase-frequency detector 1 detects the phase difference between two input signals, REF and OSC, and generates output pulses depending on the phase difference. The charge pump 2 outputs electric current according to the output signal from the phase-frequency detector 1. The loop filter 3 attenuates the output signal from the charge pump 2. In the voltage-controlled oscillator 4, output voltage Vctrl1 of the loop filter 3 is supplied to a first control terminal to control the frequency. The programmable divider 5 divides output signal fout from the voltage-controlled oscillator 4 and feeds it back to the phase-frequency detector 1. The pulse shaping circuit 6 transforms an incoming transmission pulse train TX_DATA into a prescribed transmission waveform voltage Vctrl2 and sends it to a second control terminal of the voltage-controlled oscillator 4. The sigma delta circuit 7 carries out sigma delta modulation of a constant CS representing a transmitting channel, namely a carrier frequency and outputs a frequency division number set signal for the programmable divider 5. (See Non-Patent Document 1, Seong Hwan Cho et al, "A 6.5 GHz CMOS FSK Modulator for Wireless Sensor Applications," Symposium on VLSI Digest of Technical Papers, pp. 182–185, 2002.)

Next, an explanation is given of the first conventional phase locked loop. The phase-frequency detector 1, charge pump 2, loop filter 3, voltage controlled oscillator 4, programmable divider 5, and sigma delta circuit 7 constitute a fractional-N phase locked loop. When a constant value CS which is more than N and less than N+1 is entered, the sigma delta circuit 7 outputs N or N+1 randomly in a way that the average of output signals is equal to CS. As a result, the average division number for the programmable divider 5 is a fractional number between N and N+1, namely constant CS and thus a fractional-N phase locked loop is realized. This type of fractional-N phase locked loop is described, for example, in Non-patent Document 2, Razavi, "RF Microelectronics," 1998, Prentice Hall, pp. 279–283.

Next, an explanation is given of the pulse shaping circuit 6. The pulse shaping circuit 6 shapes an incoming binary pulse train as transmission pulse train TX_DATA, into a prescribed transmission waveform and supplies transmission waveform voltage Vctrl2 to the second control terminal of the voltage controlled oscillator 4. For example, the pulse shaping circuit 6 comprises a Gaussian filter and a digital/analog (D/A) converter in order to perform GFSK (Gaussian Filtered Frequency Shift Keying), which reduces the required frequency bandwidth by a Gaussian low-pass filter.

In the first conventional phase locked loop, the transfer function for transfer from transmission waveform voltage Vctrl2 to output signal fout from the voltage-controlled oscillator 4 is a high-pass transfer function. In other words, in the phase locked loop, the loop band is wide and the symbol frequency is in a high-pass filter's blocking or transitional band, the incoming modulated signal with transmission waveform voltage Vctrl2 degrades when outputted as signal fout.

Since the loop bandwidth of the phase locked loop varies depending on the temperature or device, the rate of degradation varies accordingly. A possible approach to avoiding this may be to lower the loop band and set the symbol frequency to the passband of the high pass filter. However, this approach has a drawback that the convergence time for the phase locked loop increases and, therefore, the time to activate the phase locked loop cannot be satisfied. Therefore, in order to satisfy both convergence time and transmission requirements, the first conventional phase locked loop adopts a loop bandwidth switch method in which, for convergence the loop bandwidth is widened and, for transmission the charge pump current for the charge pump CP and the time constant for the loop filter LF are changed by the signal band to narrow the loop bandwidth.

FIG. 3 shows a second example of a conventional phase locked loop. This phase locked loop comprises a phase-frequency detector 1, a charge pump 2, a loop filter 3, a voltage controlled oscillator 4, a programmable divider 5, a Gaussian filter 8, a sigma delta circuit 7, and a digital filter 10 (DF). The Gaussian filter transforms transmission pulse train TX_DATA into a GMSK signal. The sigma delta circuit 7 is connected with an adder 9 which adds a frequency division number set signal to the output of the Gaussian filter 8. The digital filter 10 has a characteristic opposite to the loop characteristic of the phase locked loop. (See Non-patent Document 3, Michael H. Perrott et al, "A 27-mW CMOS Fractional-N Synthesizer Using Digital Compensation for 2.5-Mb/s GFSK Modulation," IEEE JSSC Vol. 32, No.12, pp.2048–2060, December 2002.)

The second conventional phase locked loop works as follows. When the phase locked loop is in a steady state, the central frequency of the voltage controlled oscillator 4 is the product of a constant CS specifying the frequency division number and the frequency fref of reference signal REF, namely CS×fref. In transmission, transmission pulse train TX_DATA enters the Gaussian filter (GF) 8 where its waveform is shaped; then it is transformed by the digital filter 10 into a signal whose degradation caused by the loop characteristic of the phase locked loop is corrected. The output from the digital filter 10 is added to the signal CS representing the carrier frequency before being introduced into the sigma delta circuit 7. The output from the sigma delta circuit 7 enters the programmable divider 7 where the frequency division number is updated.

To explain simply, let's assume that the digital filter 10 does not exist and the output of the Gaussian filter is connected with the output of the sigma delta circuit 7. It is also assumed that the frequency of transmission pulse train TX_DATA is far higher than the loop band of the phase locked loop (for example, ten times higher).

The output signal from the sigma delta circuit 7 is a signal which digitally represents a transmission-modulated signal. As this signal enters the programmable divider 5, the phase of the output signal from the programmable divider 5 changes. This phase change is conveyed to the output of the voltage controlled oscillator 4 through the phase-frequency detector 1, charge pump 2, and loop filter 3, generating a modulated signal with a central frequency of CS×fref. The transfer function which is used for the output signal form the sigma delta circuit 7 to be transferred to the output of the voltage controlled oscillator 4 is a low-pass function. Therefore, the output signal from the voltage controlled oscillator 4 is a signal which is obtained by multiplying the output signal from the sigma delta circuit 7 by the low pass transfer function of the phase locked loop.

It would be possible to output a modulated signal without the digital filter 10. However, since there is attenuation in the modulated waveform due to the low pass characteristic of the phase locked loop, there would be operational difficulty in case that the frequency of transmission pulse train TX_DATA is sufficiently high for the loop bandwidth of the phase locked loop. In the second conventional phase locked loop, the digital filter 10 is provided in order to prevent attenuation in the modulated waveform. The characteristic of the digital filter 10 is opposite to the low pass characteristic of the phase locked loop so that the transmission signal is amplified taking into consideration its degradation which would be caused by the low pass characteristic of the phase locked loop, before being introduced into the programmable divider 5. This amplification makes it possible to achieve a higher symbol rate regardless of the loop bandwidth.

The problem of the first conventional phase locked loop is explained below referring to FIG. 2. In the graph of FIG. 2, the vertical axis represents frequency f and the horizontal axis represents time t. fc represents carrier frequency, Δf modulation frequency, and ts modulation start time. If digital transmission signals are, for example, "11111111," the ideal modulated waveform should be like the one as expressed by solid line A, namely a waveform which is Δf away from carrier frequency fc. However, if the loop bandwidth is larger than the packet length, the modulated waveform would degrade like the one as expressed by alternate long and short dash line B. Therefore, the loop band of the phase locked loop should be low enough not to cause signal degradation even when the maximum packet length of transmission symbol is sent.

On the other hand, in the voltage controlled oscillator 4 as a component of the phase locked loop, a frequency drift as expressed by alternate long and two short dashes line C (FIG. 2) occurs. In order for the phase locked loop to compensate for this drift, the loop bandwidth should be wide enough to follow the frequency drift of the voltage-controlled oscillator 4 which occurs within a packet.

When the first conventional phase locked loop is used in an application that digital signals representing a succession of "1" (for example, "11111111") are transmitted, coexistence of the transmission characteristic and drift compensation characteristic would be difficult and thus another means to reduce drift of the voltage controlled oscillator 4 is needed.

In the second conventional phase locked loop, a high clock rate is needed because the sigma delta circuit 7 and the digital filter 10 require highly modulated waveform accuracy. This means that frequency fref of reference signal REF mush be high and the digital circuit, including the phase-frequency detector 1, the sigma delta circuit 7, and the digital filter 10, must operate at high speed. This raises problems related to operating limit frequencies and power consumption.

In short, in the first conventional phase locked loop, when signals representing a succession of "1" (for example, "11111111") are transmitted, modulated signal degradation occurs as the phase locked loop locks in; and in the second conventional phase locked loop, since, in order to reduce transmission signal errors, it must operate at a sampling frequency which is sufficiently high for the symbol rate, fref must be set high for the symbol rate, and therefore, the digital circuit including the phase-frequency detector might have trouble in operation.

SUMMARY OF THE INVENTION

The present invention has been made in view of the above circumstances and provides a variable loop bandwidth phase locked loop which works without modulated signal degradation even when a succession of "1" (for example, "11111111") is entered, and, even at a high symbol rate, maintains a low reference signal frequency to maintain low sampling frequencies of the phase-frequency detector and the sigma delta circuit.

According to one aspect of the present invention, a phase locked loop comprises: a phase-frequency detector which detects the phase difference between a reference signal introduced into one input terminal and an input signal introduced into the other input terminal, and generates output pulses according to the phase difference; a charge pump which outputs electric current according to an output signal from the phase-frequency detector; a loop filter which attenuates output of the charge pump; a voltage controlled oscillator in which the frequency of an output signal is controlled according to the output voltage of the loop filter; and a programmable divider which divides an output signal from the voltage controlled oscillator according to input division number data and feeds it back to the other input terminal of the phase-frequency detector. The phase locked loop further has: a first modulator which transforms an incoming baseband signal into an integer signal for specifying a division number and sends it to a control terminal of the programmable divider; a second modulator which shapes an incoming baseband signal into a prescribed signal waveform and sends it to the voltage controlled oscillator; and a loop bandwidth selector which changes the loop bandwidth according to a control signal.

Other potential features and advantages of the present invention will be apparent from detailed description of preferred embodiments given below.

BRIEF DESCRIPTION OF THE DRAWINGS

The invention will be more particularly described with reference to the accompanying drawings, in which.

DETAILED DESCRIPTION OF THE PREFERRED EMBODIMENTS

Next, phase locked loop circuits as preferred embodiments of the present invention will be described in detail referring to the accompanying drawings.

Embodiment 1

Figure 1:
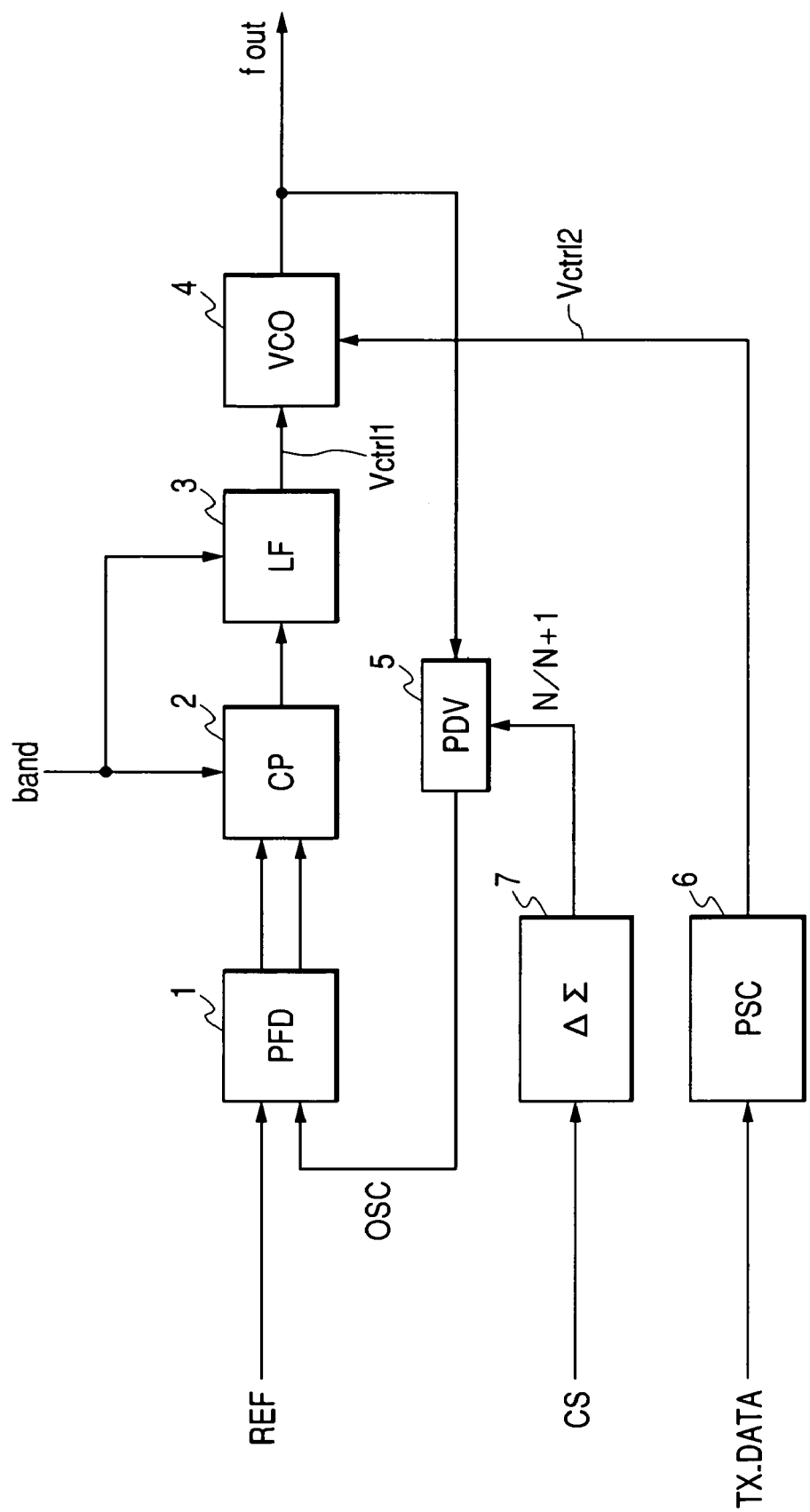
FIG. 1 shows the configuration of a first conventional phase locked loop as an example.
Figure 2:
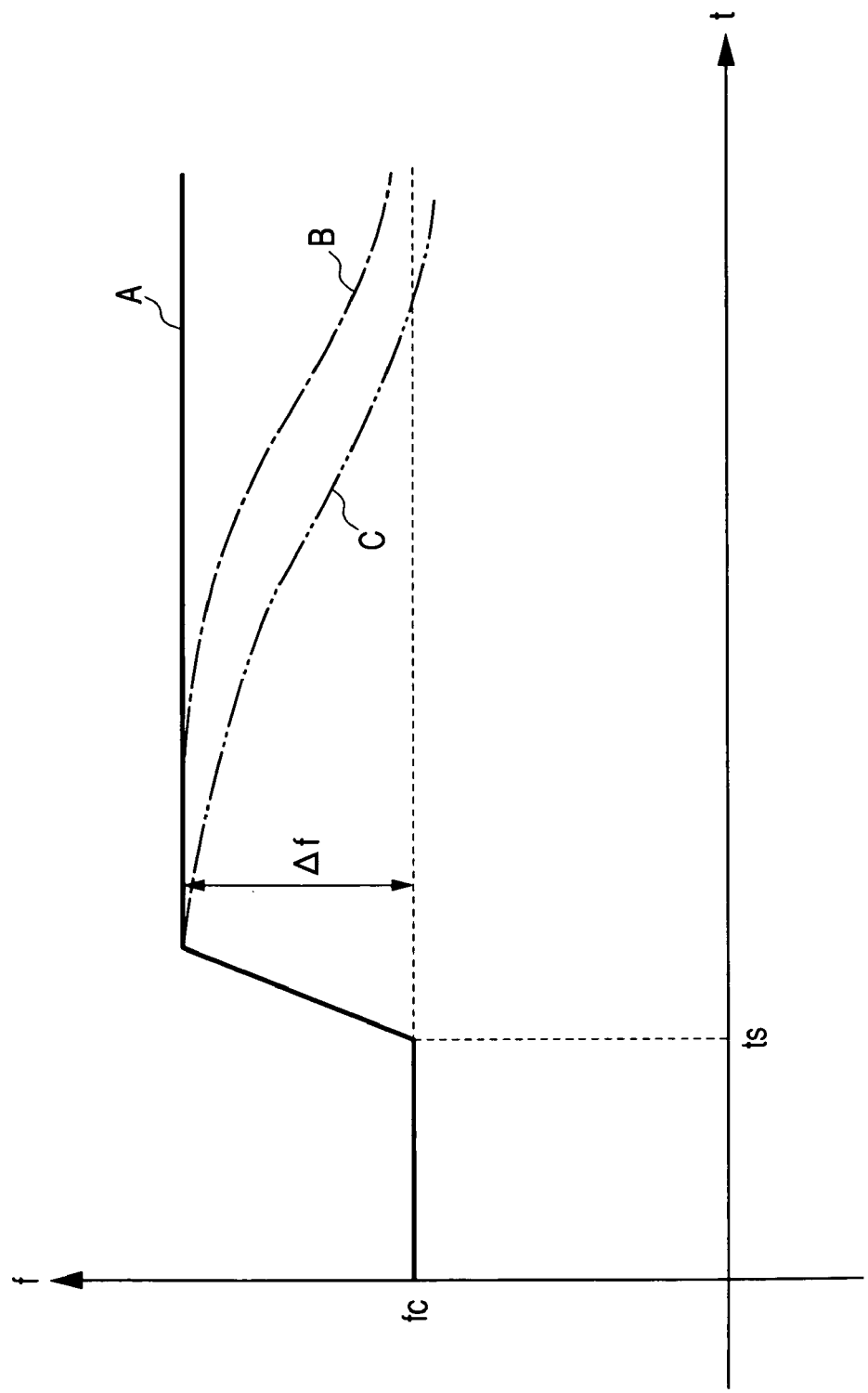
FIG. 2 is a graph showing the transmission characteristic of the first conventional phase locked loop.
Figure 3:
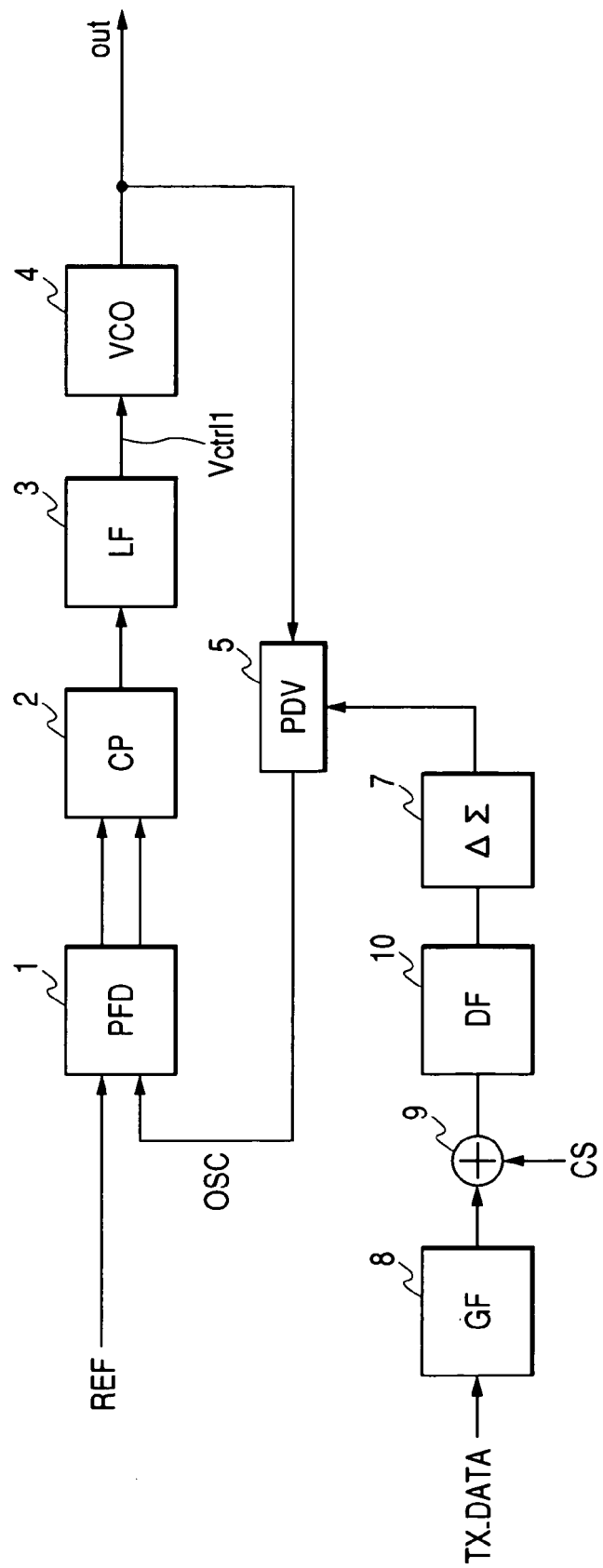
FIG. 3 shows the configuration of a second conventional phase locked loop as an example.
Figure 4:
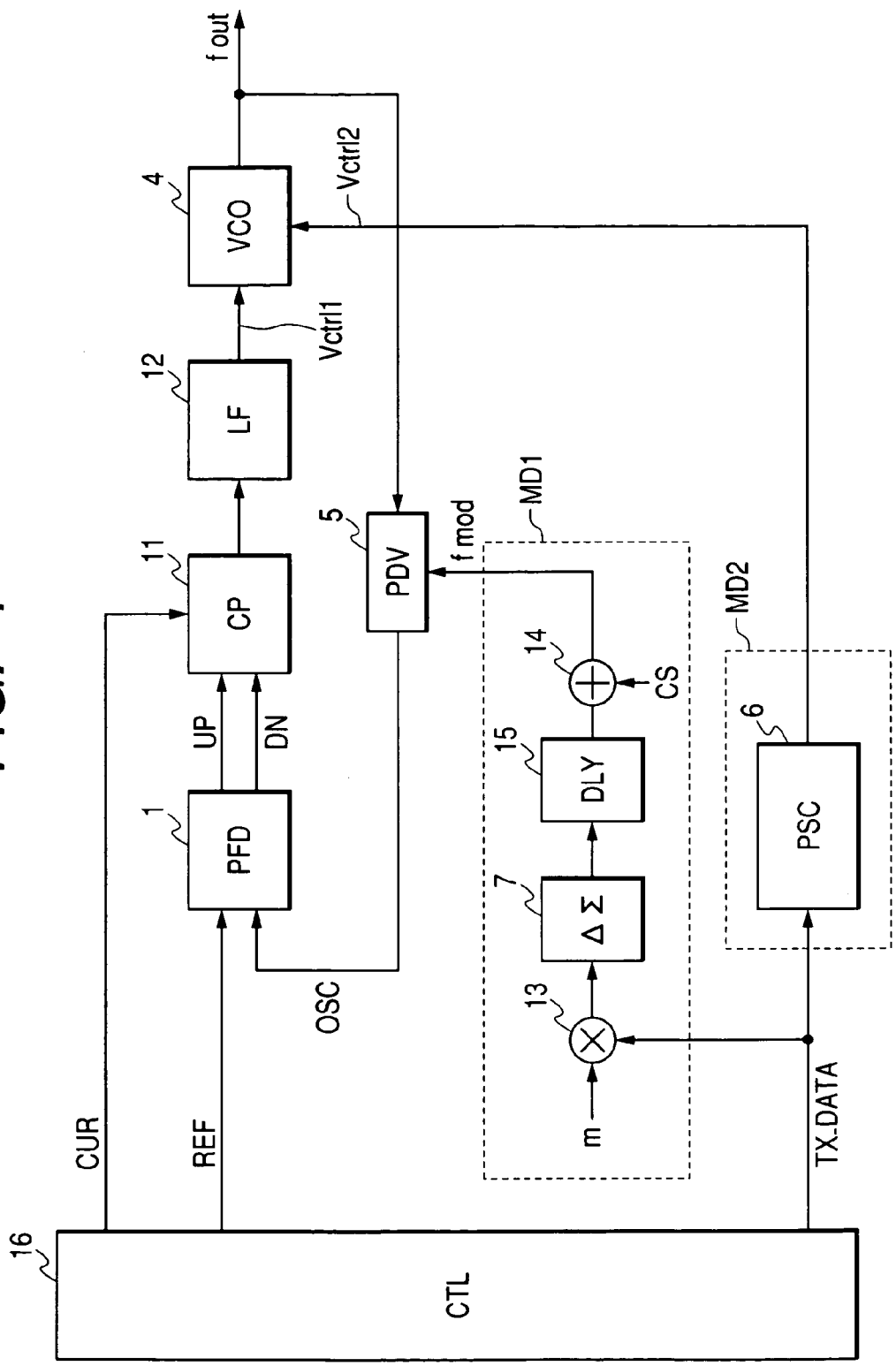
FIG. 4 is a circuit block diagram showing a phase locked loop according to a first embodiment of the present invention.

In FIG. 4, a block diagram of a phase locked loop according to the first embodiment of the present invention, the same components as those of the conventional circuit shown in FIGS. 1 and 2 are designated with the same reference numerals. This phase locked loop comprises a phase-frequency detector 1, a variable current charge pump 11, a loop filter 12, a voltage controlled oscillator 4, and a programmable divider 5. It also comprises: a control circuit (CCL) 16 which controls the time of issuing reference signal REF, transmission symbol TX_DATA, and current control signal CUR for the variable current charge pump 11; a first modulator MD1 which transforms transmission pulse train TX_DATA into a prescribed integer pulse train and sends it to a division number set terminal of the programmable divider 5; and a second modulator MD2 which shapes transmission pulse train TX_DATA into a prescribed signal waveform and sends it to the voltage controlled oscillator 4.

In this embodiment, for example, the first modulator MD1 comprises: a multiplier 13 which multiplies a transmission pulse train by a constant m; a sigma delta circuit 7 which transforms the output of the multiplier 13 into a prescribed pulse train; and an adder 14 which adds a constant representing a carrier frequency to the output of the sigma delta circuit 7. The second modulator MD2 comprises a pulse shaping circuit 6 which transforms transmission pulse train TX_DATA into a prescribed signal waveform and sends it to the voltage-controlled oscillator 4. In addition, there is a delay circuit (DLY) 15 between the sigma delta circuit 7 and adder 14 of the first modulator MD1, which adjusts a phase error between the first modulator MD1 and the second modulator MD2.

This configuration is characterized in that the delay circuit 15 is provided to control the output phase difference between the pulse shaping circuit 6 and the sigma delta circuit 7; the loop bandwidth can be changed by the variable current charge pump 11; and the multiplier 13 for multiplication by a constant is located between transmission pulse train TX_DATA and the sigma delta circuit 7.

Figure 5:
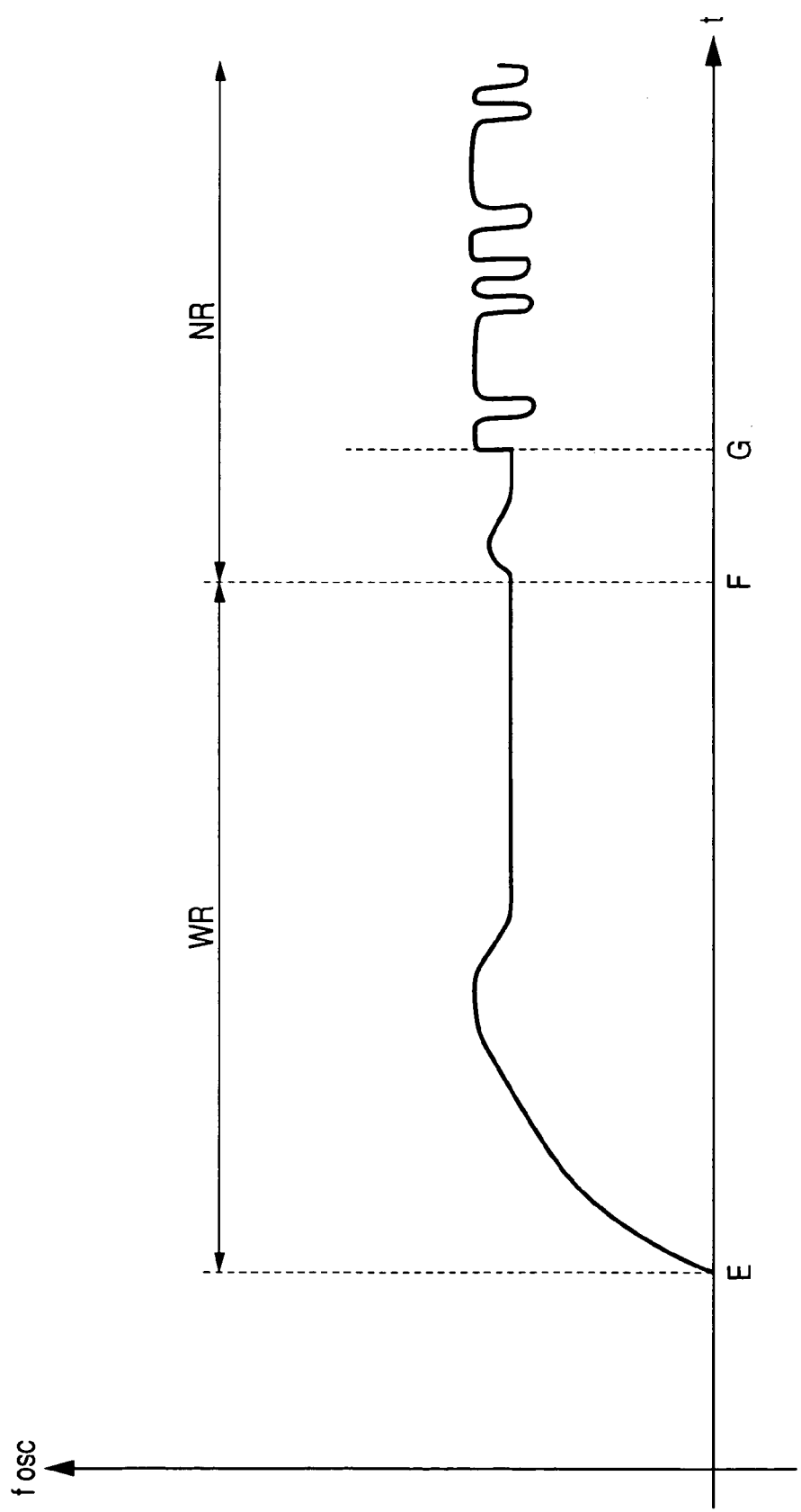
FIG. 5 is a graph showing change in the oscillation frequency of a voltage-controlled oscillator with time to explain the transmission start sequence for a phase locked loop according to the present invention.

In this configuration of the phase locked loop according to the present invention, as transmission pulse train TX_DATA is entered, the voltage-controlled oscillator 4 outputs a modulated signal from its output terminal. First, the transmission start sequence for the phase locked loop is explained below referring to FIG. 5. In the graph of FIG. 5, the vertical axis represents oscillation frequency fosc of the voltage-controlled oscillator 4 and the horizontal axis time t.

At time E, the control circuit 16 issues reference signal REF to activate the phase locked loop, and then sets a high current value for the variable current charge pump 11 through current control signal CUR to broaden the loop bandwidth; then convergence to a frequency begins according to the CS signal as a constant representing a carrier frequency. As shown in the graph, the loop bandwidth is broad in the WR period.

Then, at time F, the state of current control signal CUR is changed to decrease the current of the variable current charge pump 11 to narrow the loop bandwidth. In the NR period of the graph, the loop bandwidth is narrow.

Then, after the loop locks in again to absorb the phase-frequency difference which arises at the time of loop bandwidth change, transmission pulse train TX_DATA is inputted at time G to start transmission.

How the components of the phase locked loop in this embodiment function is explained next.

The pulse shaping circuit 6 shapes transmission signal TX_DATA into a prescribed waveform and sends it to the second control terminal of the voltage controlled oscillator 4 for modulation.

In this configuration, the first control terminal of the voltage-controlled oscillator 4 is connected with the output terminal of the loop filter 12 and its second control terminal is connected with the pulse shaping circuit 6. As a consequence, the first control terminal determines the central frequency and the modulation signal introduced into the second control terminal is added to the central frequency to perform modulation. The voltage controlled oscillator 4 used here may be the same as in the first conventional phase locked loop (see FIG. 4 on page 184 of Non-patent Document 1). The pulse shaping circuit 6 used here may be, for example, composed of a digital filter and a D/A converter.

Transmission pulse train TX_DATA is multiplied by a constant m in the multiplier 13 before being introduced into the sigma delta circuit 7. The sigma delta circuit 7 carries out sigma delta modulation of the received signal and the adder 14 adds a constant CS representing a carrier frequency to the signal thus modulated. The output of the adder 14 enters the programmable divider 5 to update the division number. The resulting phase change in the output of the programmable divider 5 is transferred through the phase-frequency detector 1, variable current charge pump 11, and loop filter 12 to the voltage controlled oscillator 4 so that modulation takes place.

Figure 6:
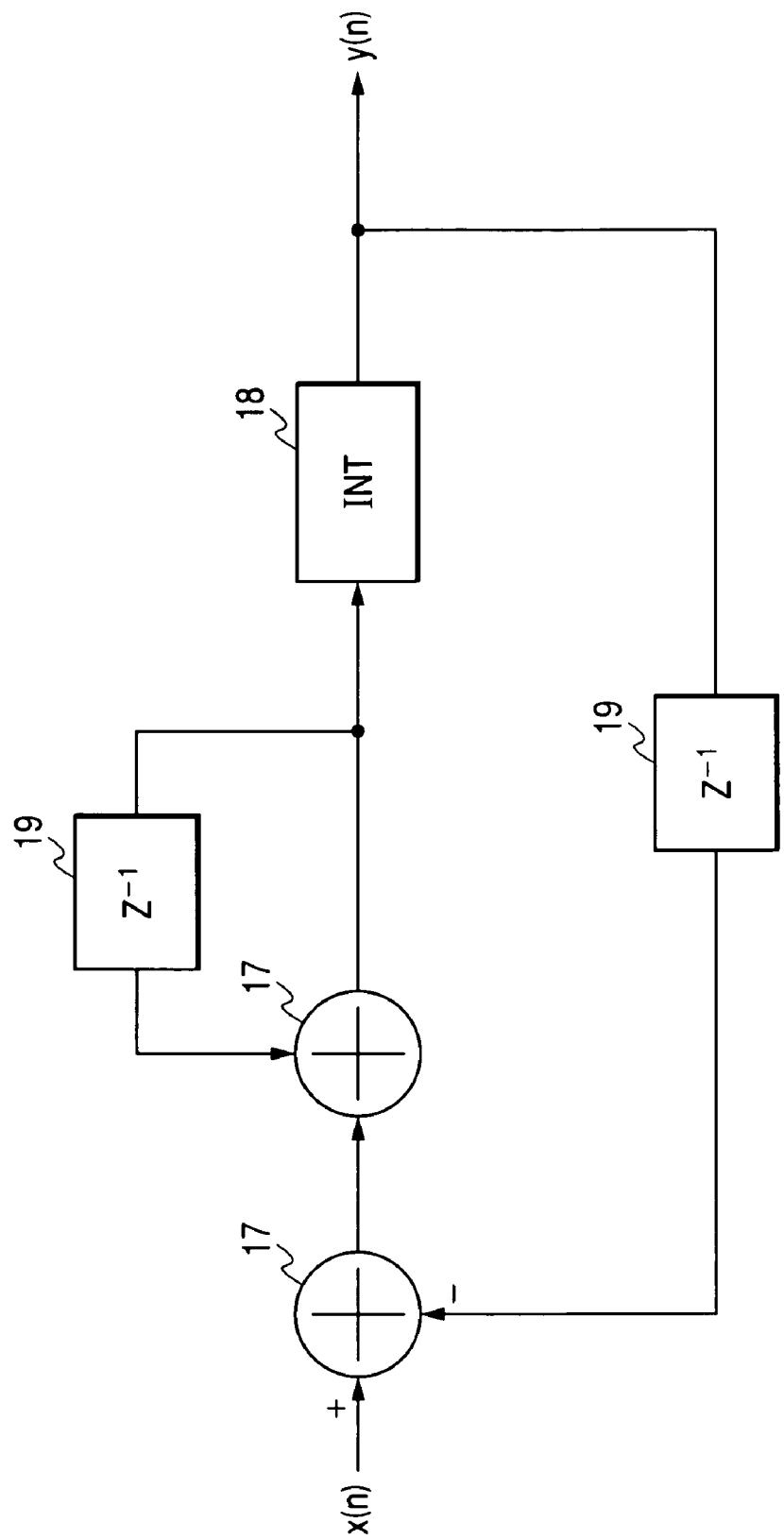
FIG. 6 shows the configuration of a sigma delta circuit as an example according to the first embodiment.

The configuration of the sigma delta circuit 7 used in this embodiment is not limited. For example, it may be a first order sigma delta circuit like the one shown in FIG. 6. Here, x(n) represents input signal (output from the multiplier 13); y(n) output signal (input to the adder 14); 17 an adder; 18 a quantizer (INT: Integer) which outputs an integer closest to the input value; and 19 a delay circuit.

Constant m is determined according to frequency fref of reference signal REF, the symbol rate of transmission pulse train TX_DATA, carrier frequency fc, division number k, and modulation frequency fmod. How the constant m is determined is explained below on the assumption that fref=1 MHz, fc=1 GHz, k=1000, fmod=100 kHz and the symbol rate is 1 Mbps and the signals represent, for example, "111-1-111-1-1-1."

Let's assume that the phase locked loop is in a steady state, namely the output frequency of the voltage-controlled oscillator 4 is 1 GHz. In this case, as "−1" is entered fro the transmission symbol, the modulated signal from the pulse shaping circuit 6 modulates the frequency of the voltage controlled oscillator 4 from 1 GHz to 999.9 MHz. Since the phase locked loop locks to 1 GHz before the modulation, when the signal of 999.9 MHz is fed back to the phase-difference detector 1, a phase difference occurs and the phase locked loop begins lock-in operation, causing a degradation in the modulated signal.

To prevent this lock-in, the division number should be 999.9. Therefore, when symbol "−1" is entered, the division number should be divided by −0.1; when symbol "1" is entered, the division number should be divided by +0.1, which prevents signal degradation from being caused by lock-in in the phase locked loop. However, actually, the programmable divider 5 cannot take a decimal division number. For this reason, ±0.1 signal is entered into the sigma delta circuit 7 to carry out sigma delta modulation and ±1 signal is entered into the programmable divider 5. In other words, the multiplier 13 multiplies incoming transmission symbols "+1" and "−1" by a constant m to transform them into "+0.1" and "−0.1" respectively before being introduced into the sigma delta circuit 7. In this case, therefore, m=1/10. Here, for digital signals, the number of decimals is limited and a constant m may not be expressed. If that is the case, the constant m need not be 1/10; instead, a number close to 1/10 which can be expressed by digital signals may be selected.

Furthermore, for example, if fref=2 MHz and the transmission symbol rate is 1 Mbps, namely the frequency of reference signal REF is too high for the symbol rate, the transmission symbol "1" may be repeated to express "11" (a signal of the same frequency as that of reference signal REF) to enter it into the multiplier 13.

Figure 7:
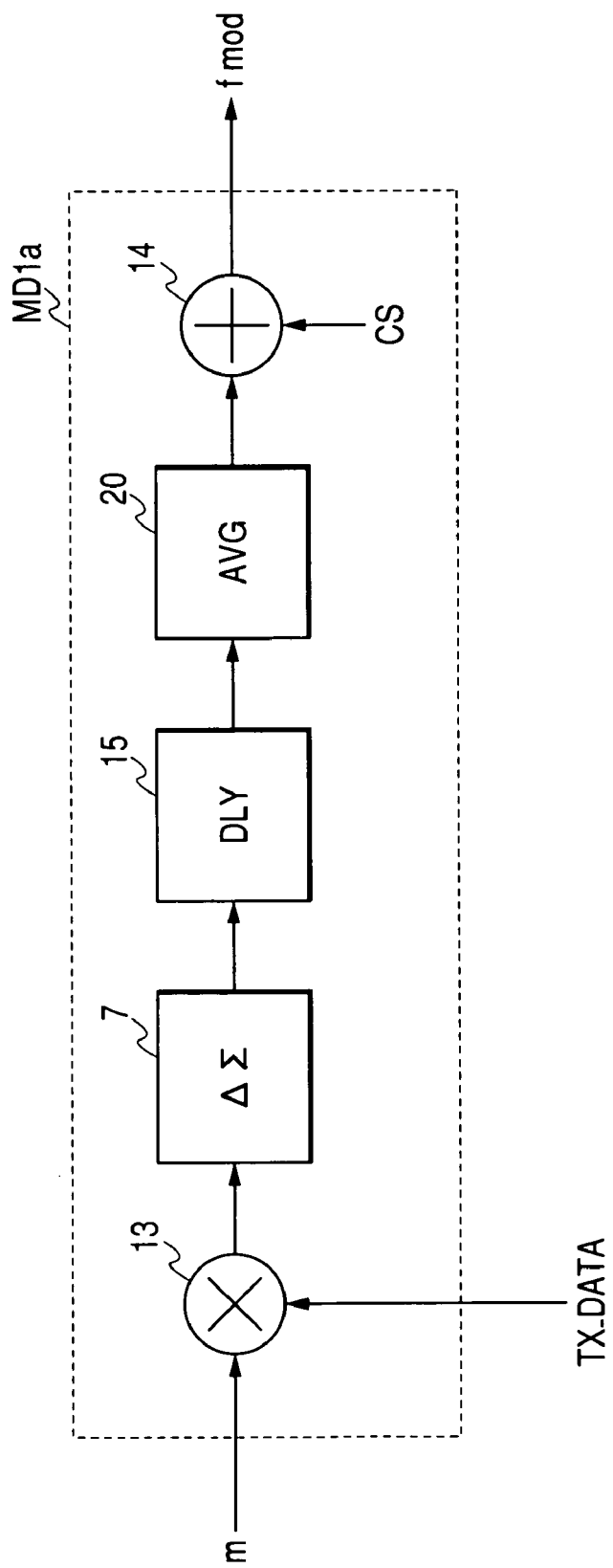
FIG. 7 shows the configuration of a modulation circuit as another example according to the first embodiment.

On the other hand, if the frequency of reference signal REF is too low for the symbol rate, a modulator MD1*a* as shown in FIG. 7 may be used as the first modulator MD1. Referring to FIG. 7, the modulator MD1*a* comprises: a multiplier 13 which multiplies a transmission pulse train by a constant m; a sigma delta circuit 7 which transforms the output of the multiplier 13 into a prescribed pulse train; an averaging circuit (AVG) 20 which output an average of outputs from the sigma delta circuit 7 in a given zone; and an adder 14 which adds a constant CS representing a carrier frequency to the output of the averaging circuit 20.

For example, if fref=0.5 MHz, the transmission symbol rate is 1 Mbps, and transmission symbol "1-111" corresponds to "1-111" as an output of the sigma delta circuit 7, then the averaging circuit 20 takes the average of two transmission symbols, and outputs "01" at 0.5 MHz frequency.

As described above, in this embodiment, the phase locked loop works even when the frequency of reference signal REF is below the symbol rate, which means that a low frequency reference signal REF can be used.

Figure 8:
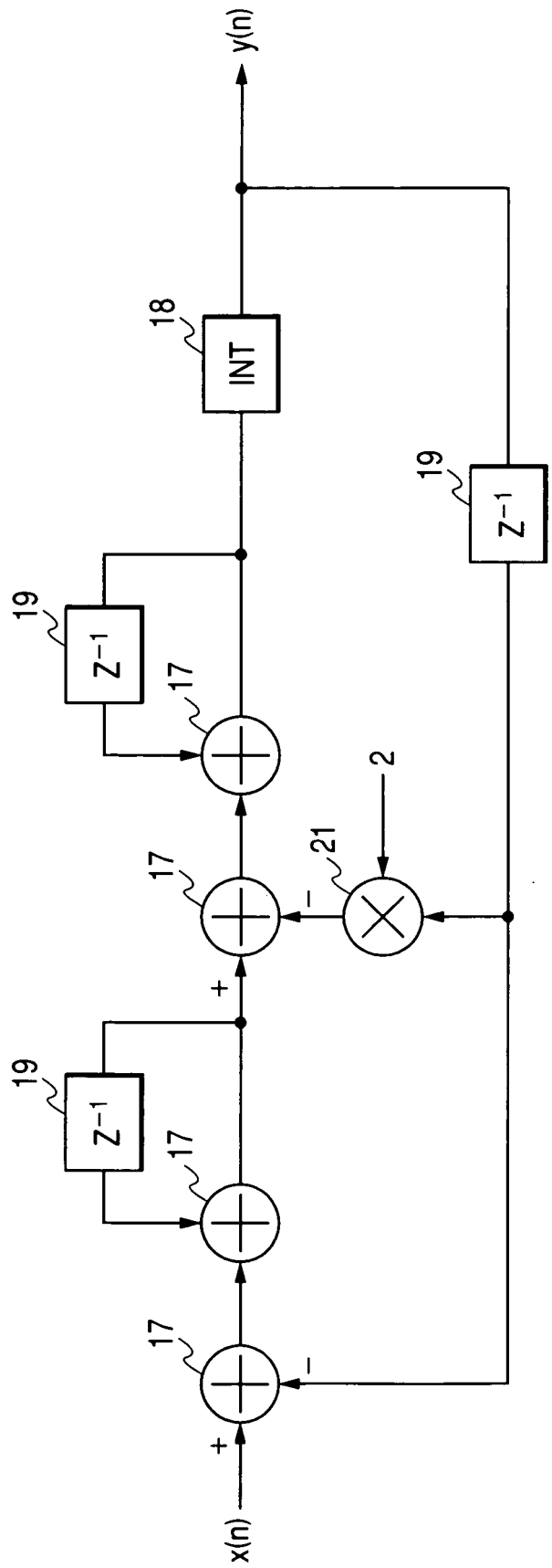
FIG. 8 shows the configuration of a sigma delta circuit as another example according to the first embodiment.

Instead of the first order sigma delta circuit, a second order sigma delta circuit as shown in FIG. 8 may be used. In FIG. 8, x(n) represents input signal (output from the multiplier 13); y(n) output signal (input to the adder 14); 17 an adder; 18 a quantizer (INT) which outputs an integer closest to the input value; 19 a delay circuit; and 21 a multiplier for multiplication by a constant 2. In the second order sigma delta circuit, the pattern which appears at output y(n) is more random than in the first order sigma delta circuit, which leads to improvement in the output spectral characteristic.

Figure 9:
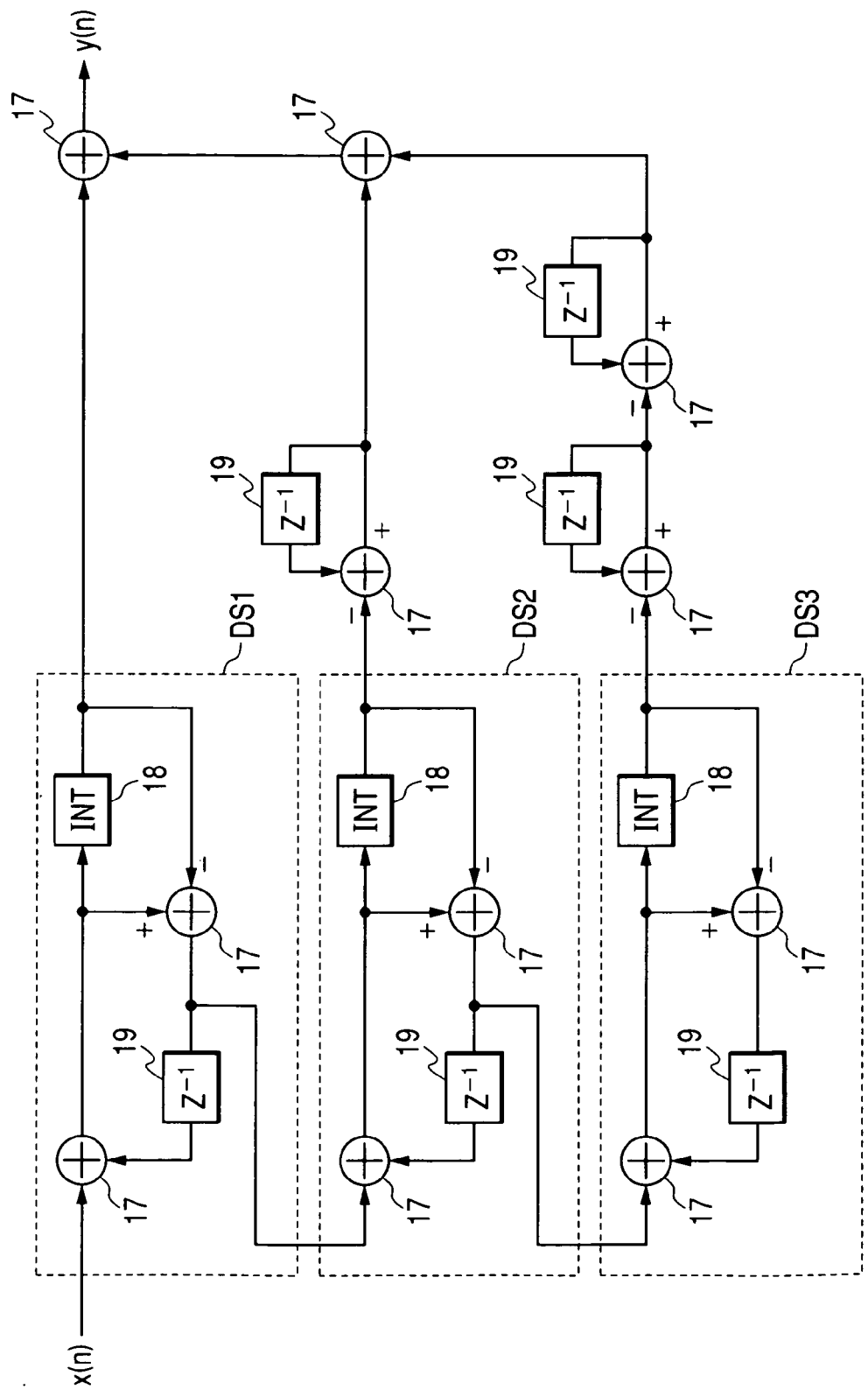
FIG. 9 shows the configuration of a multi-stage sigma delta circuit as an example according to the first embodiment.
Figure 10:
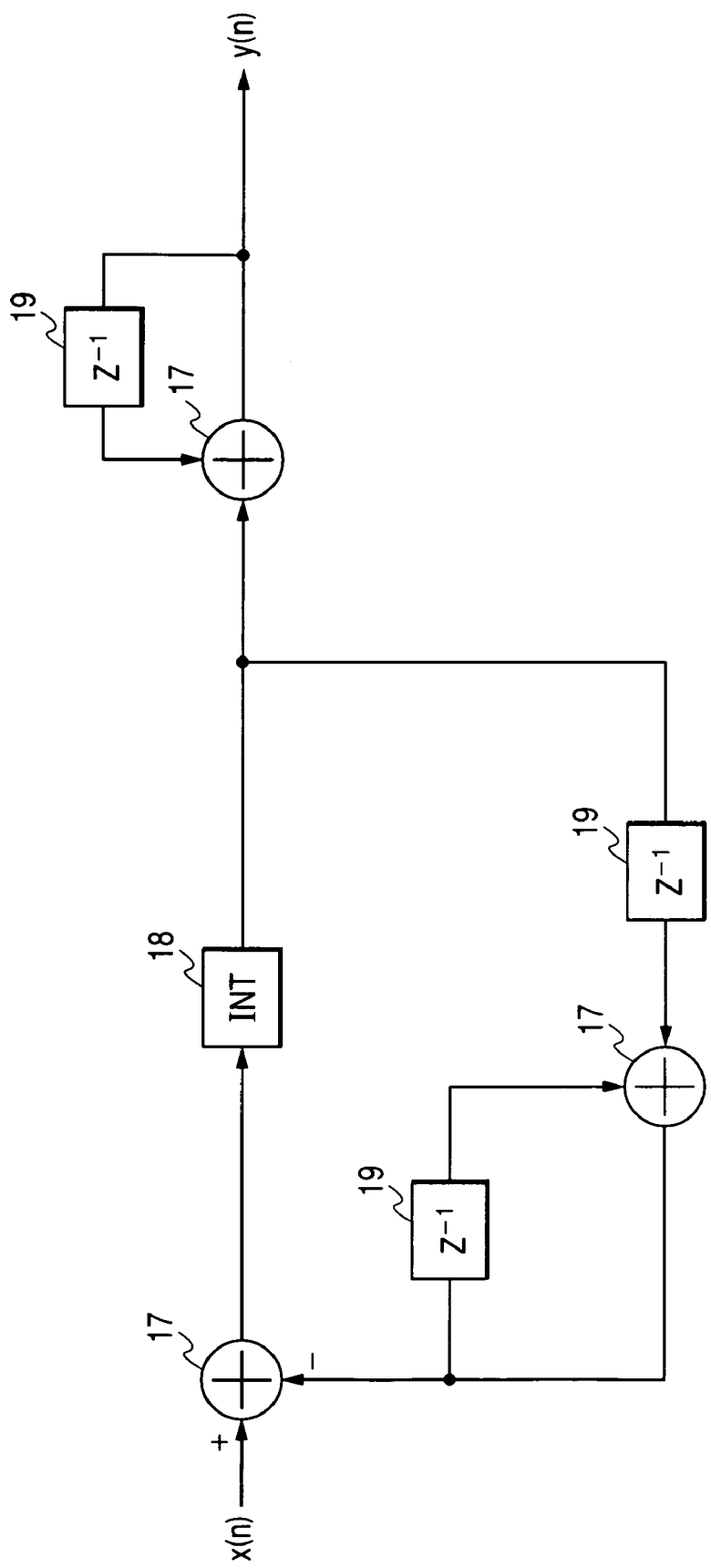
FIG. 10 shows the configuration of a delta modulation circuit as an example according to the first embodiment.

Furthermore, a multi-stage sigma delta circuit as shown in FIG. 9 or a delta modulation circuit as shown in FIG. 10 can be used instead of the first order sigma delta circuit.

In FIG. 9, x(n) represents input signal (output from the multiplier 13); y(n) output signal (input to the adder 14); 17 an adder; 18 a quantizer which outputs an integer closest to the input value; and 19 a delay circuit. DS1 represents a first stage as a first order sigma delta circuit; DS2 a second stage as a first order sigma delta circuit; and DS3 a third stage as a first order sigma delta circuit. The multi-stage sigma delta circuit uses plural stable sigma delta circuits lower than the second order level to make up a second order or higher-level sigma delta circuit to assure stable operation. In the multi-stage sigma delta circuit as shown in FIG. 9, the pattern which appears at output y(n) is more random than in the first order sigma delta circuit and second order sigma delta circuit, which leads to improvement in the output spectral characteristic.

In FIG. 10, x(n) represents input signal (output from the multiplier 13); y(n) output signal (input to the adder 14); 17 an adder; 18 a quantizer which outputs an integer closest to the input value; and 19 a delay circuit. While noise of output signal decreases at low frequencies and increases at high frequencies in a sigma delta circuit, signals appearing at output y(n) in the delta modulation circuit have a frequency characteristic which is flat across the band.

Figure 11:
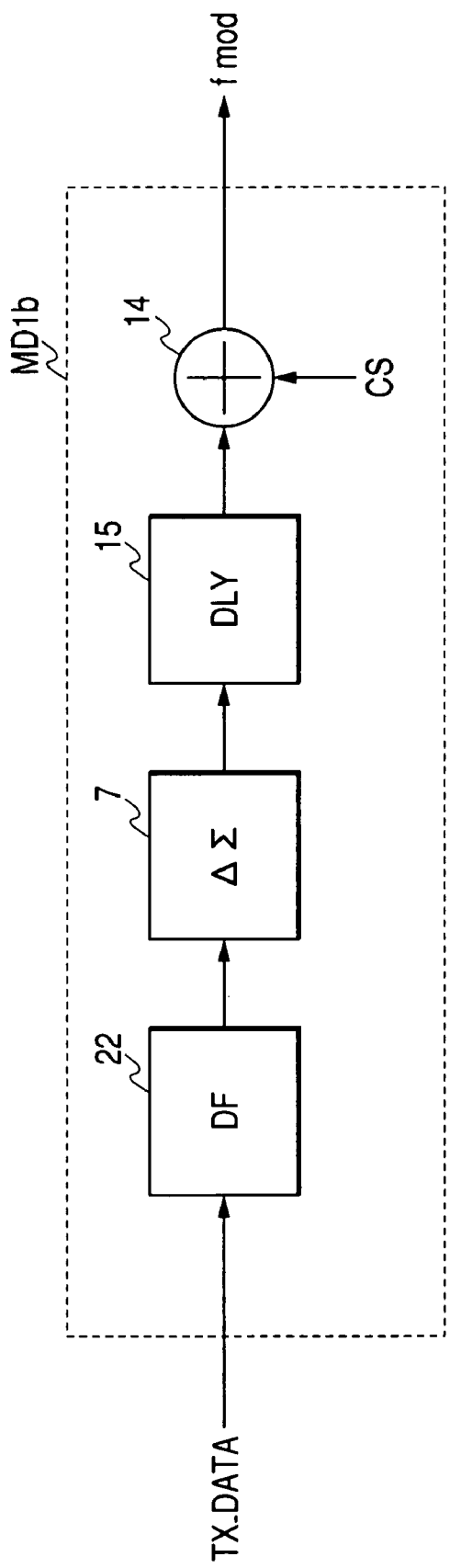
FIG. 11 shows the configuration of a modulation circuit as another example according to the first embodiment.

As the first modulator MD1, a modulator MD1*b* (FIG. 11) may be used instead of a modulator MD1*a*; in the former, a digital filter 22 for attenuating transmission signal TX_DATA to a prescribed waveform is replaced by what is composed of a constant m and the multiplier 13. Alternatively, the loop works similarly even when the transmission waveform which depends on transmission signal TX_DATA is read from a data table and introduced into the sigma delta circuit 7.

Between the output of the adder 14 in the above first modulator MD1 and the output of the pulse shaping circuit 6 in the second modulator MD2, there is a phase difference because of the circuit structural difference. If a signal should be transmitted without this phase difference taken into consideration, a phase error occurs between the modulated signal generated by the pulse shaping circuit 6 and a division number update signal from the adder 14, causing deformation of the modulation waveform.

Therefore, the delay circuit 15 is used to adjust the phase difference in a way to eliminate the phase error between the pulse shaping circuit 6 and the adder 14. The location of the delay circuit 15 is not limited to the location indicated in FIG. 4; it may be located between the sigma delta circuit 7 and the multiplier 13, or between the adder 14 and the programmable divider 5, or inside the pulse shaping circuit 6. The number of delay circuits inserted is not limited to one; more than one delay circuit may be used.

As can be understood from the foregoing explanation, when a succession of signals like "11111111" are sent, the multiplier 13, sigma delta circuit 7, delay circuit 15 and adder 14 maintain the modulation frequency constant, thereby preventing transmission waveform degradation which is the problem of the first conventional phase locked loop mentioned earlier.

In this embodiment, since the signal which comes from the pulse shaping circuit 6 is shaped by a digital filter or the like, an accurately modulated waveform is obtained. On the other hand, the multiplier 13 multiplies the signal by a prescribed constant m and outputs an unshaped signal; if so, the signal going from the adder 14 of the first modulator MD1 to the programmable divider 5 would contain an error, or a deviation from the desired transmission waveform. For this reason, in order to achieve modulation with high accuracy, this embodiment is designed so that the second modulator MD2 as a modulation channel for the pulse shaping circuit 6 has a higher contribution ratio than the first modulator MD1 as a modulation channel for the adder 14.

Assuming that the loop bandwidth of the phase locked loop is 30 kHz and the symbol rate is 1 MHz, the process is explained concretely below. The phase locked loop has a high pass characteristic with a cut-off frequency of 30 kHz for signals coming from the second modulator MD2 and a low pass characteristic with a cut-off frequency of 30 kHz for modulated signals coming from the modulator MD1. When the high pass characteristic and the low pass characteristic are combined, a flat all-pass characteristic is attained.

Transmission symbols with a symbol rate of 1 MHz are in the band from 0 Hz to 1 MHz. As such a symbol is transmitted, a modulated signal to be outputted from the voltage-controlled oscillator 4 is generated by the second modulator MD2 in the range from 0 Hz to 30 kHz and by the first modulator MD1 in the range from 30 kHz to 1 MHz.

In the present invention, the loop bandwidth for transmission is made narrow in order to take advantage of the abovementioned characteristics of the phase locked loop. For example, if the loop bandwidth for transmission is 5 kHz, the second modulator MD2 generates a modulated signal in the range from 0 Hz to 5 kHz and the first modulator MD1 generates a modulated signal in the range from 5 kHz to 1 MHz. Hence, many modulated signals are generated by the second modulator MD2 and a few modulated signals are generated by the first modulator MD1 so that modulation errors can be reduced.

When the loop bandwidth of the phase locked loop is fixed at a low level, it takes a lot of time for the phase locked loop to converge. Hence, the control circuit 16 is provided to widen the loop bandwidth for convergence and narrow it for transmission using current control signal CUR, thereby permitting high convergence speed and reduction in transmission waveform errors.

Figure 12:
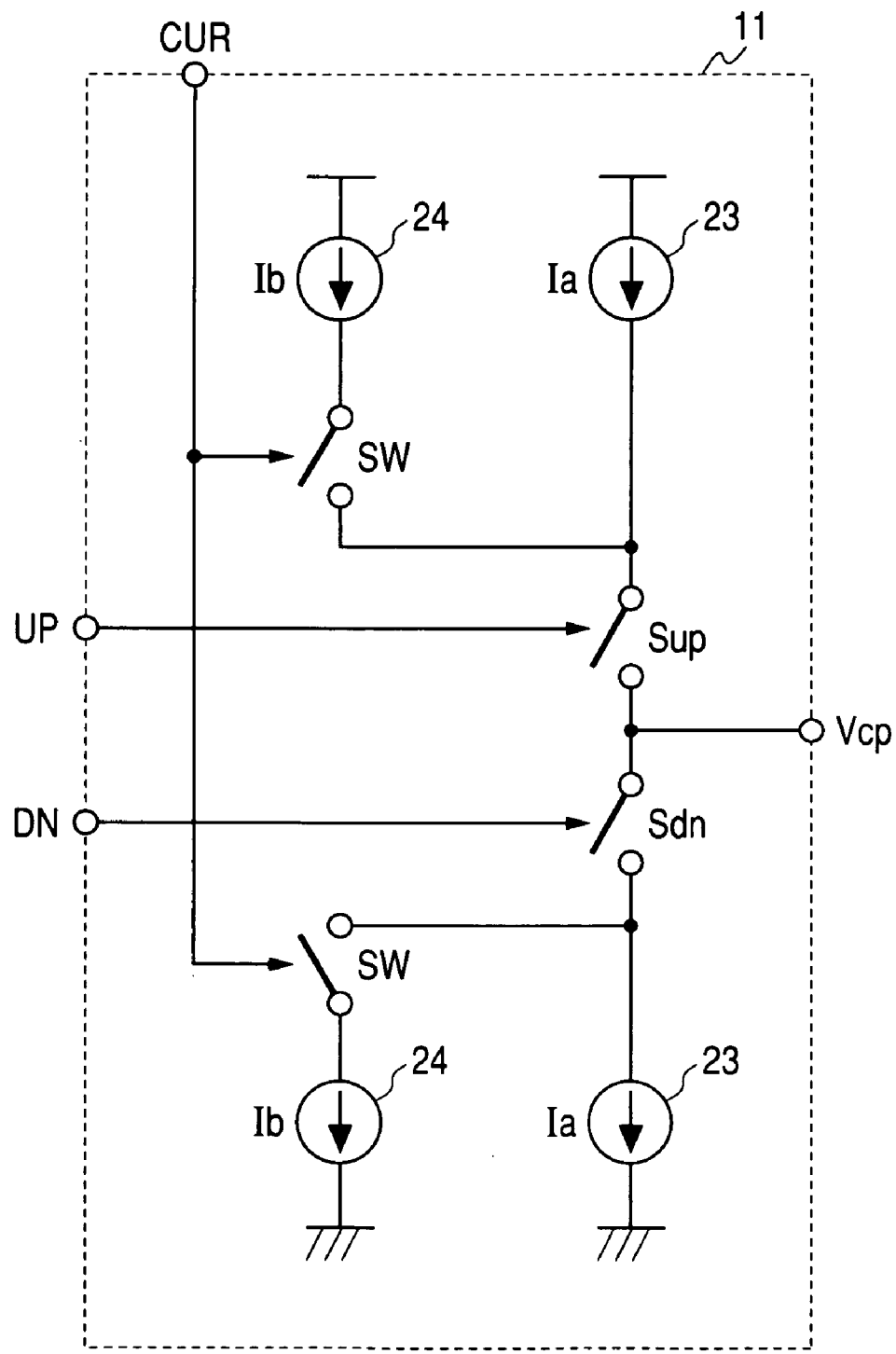
FIG. 12 shows the configuration of a variable current charge pump circuit as an example according to the first embodiment.

Specifically, the current for the charge pump 11 at the time of transmission is made lower than that at the time of convergence to change the loop bandwidth. Here is an example of the circuit of the variable current charge pump 11. FIG. 12 shows an example of a binary (2-value) current control charge pump. In this charge pump circuit, signal UP (DN) from the phase-frequency detector 1 at the preceding step turns on or off switch Sup (Sdn) to inject current into or pull current from output terminal Vcp of the charge pump. The value of the injected or pulled current is determined by the sum of the currents of current sources 23 and 24 connected with switch Sup (Sdn). In FIG. 12, the current sources 23 and 24 are respectively sources for currents Ia and Ib. The current source 23 is connected to, or disconnected from, Sup (Sdn) by switch SW. Switch SW is turned on or off according to current control signal CUR.

Consequently, when the current control signal CUR turns off switch SW, the sum of currents of the current source connected with switch Sup (Sdn) is Ia. On the other hand, when the current control signal CUR turns on switch SW, the sum of currents of the current sources connected with switch Sup (Sdn) is Ia+Ib. This makes up a charge pump which provides two current value options, Ia and Ia+Ib.

In FIG. 12, the current control signal CUR is a signal of 1 bit. However, it may be a signal of multiple bits and plural switches SW and current sources 24 may be connected in parallel with the current source 23 so that more than two current value options are available.

As discussed above, in the phase locked loop according to this embodiment, even when a succession of signals are entered, there is no degradation in modulated signals; and even when the symbol rate is high, the frequency of reference signal, fref, remains low; and the sampling frequencies of the phase-frequency detector 1 and the sigma delta circuit 7 remain low.

Embodiment 2

Figure 13:
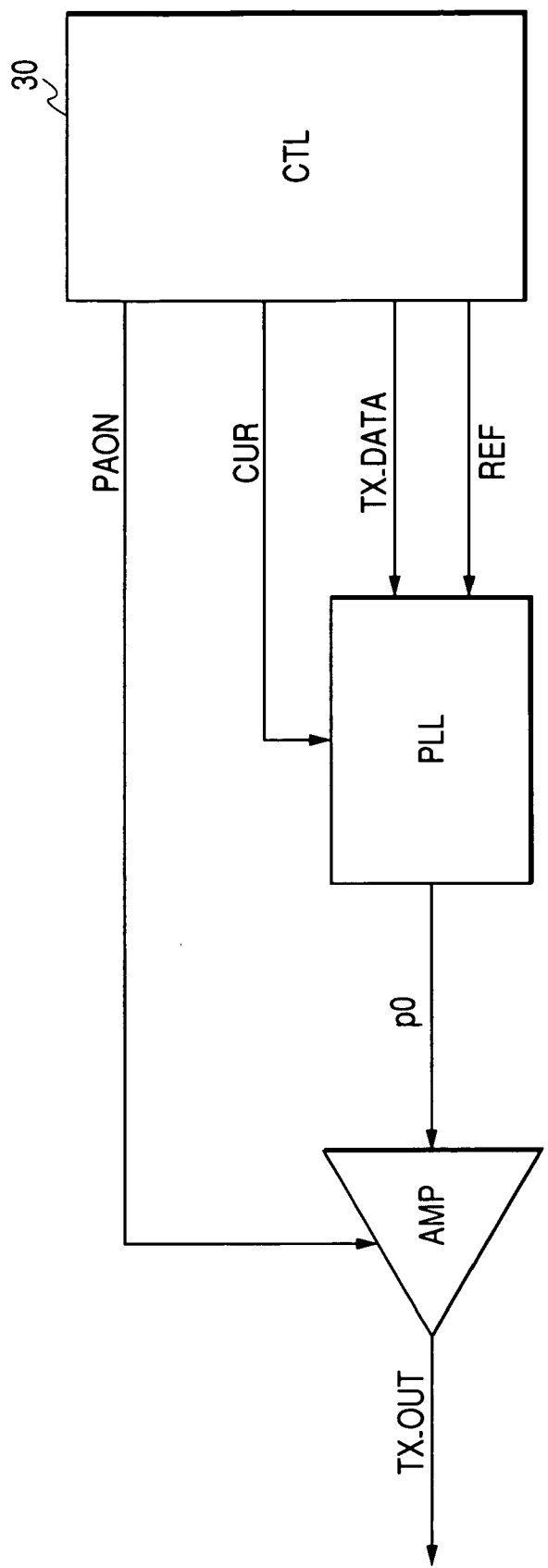
FIG. 13 shows the configuration of a phase locked loop according to a second embodiment of the present invention.

FIG. 13 is a block diagram showing a phase locked loop according to the second embodiment of the present invention. This embodiment concerns a data transmission circuit as an application example of the phase locked loop described as the first embodiment. As shown in FIG. 13, a control circuit 30 sends reference signal REF, transmission symbol TX_DATA, current control signal CUR, and amplifier On/Off control signal PAON to a transmission circuit (which is composed of a phase locked loop PLL and an amplifier AMP) to control operation for transmission. The phase locked loop PLL is the same one as described above as the first embodiment whose configuration is as shown in FIG. 4. For the first and second modulators MD1 and MD2, as described above in connection with the first embodiment, the sigma delta circuit 7 may be a first order or second order sigma delta circuit or a delta modulation circuit; and the pulse shaping circuit 6 may be composed of a Gaussian filter and a D/A converter.

For transmission, the circuit operates as follows.

First, the charge pump current value in the phase locked loop PLL is set according to current control signal CUR. The charge pump current value is set so as to ensure that the phase locked loop has a broad loop bandwidth.

After a waiting time for the phase locked loop to lock to a frequency which matches the reference signal REF and the phase locked loop frequency division number, the control circuit 30 issues signal PAON to activate the amplifier AMP.

As the amplifier AMP is activated, the output frequency of the phase locked loop fluctuates because of a power fluctuation or similar reason. After a waiting time for the frequency fluctuation to be absorbed, the control circuit 30 narrows the loop bandwidth according to the current control signal CUR.

When the loop bandwidth is changed, the phase locked loop PLL locks in again in order to absorb a phase-frequency difference that occurs because of a power fluctuation or similar reason.

After a waiting time for the phase locked loop to finish this lock-in, the control circuit 30 sends transmission pulse train TX_DATA to the phase locked loop.

The phase locked loop transforms the transmission pulse train TX_DAT into a modulated signal p0 using the first and second modulators and sends it to the amplifier AMP. The amplifier AMP amplifies the output signal p0 from the phase locked loop and outputs it as signal TX_OUT. For example, in a radio communication, the output signal TX_OUT is released into the air as a radio wave through a filter or antenna, and carried to another receiving circuit.

According to this embodiment, since the data transmission circuit uses the phase locked loop according to the first embodiment, even when data signals in the form of a succession of "1" like "11111111" come from the control circuit 30, no modulated signal degradation occurs and therefore data transmission takes place properly without errors in transmission signals from the data transmission circuit.

According to the present invention, as clearly indicated by the above embodiments, the first modulator as a component of the phase locked loop makes it possible to change the division number for the programmable divider at low frequencies so that no modulated signal degradation occurs with transmission of signals in the form of a succession of "1" like "11111111" and the phase-frequency detector does not malfunction due to high speed clock frequencies. Variations of the present invention are also possible and envisioned by the present invention.

What is claimed is:

1. A phase locked loop, comprising:
    a phase-frequency detector that detects a phase difference between a reference signal introduced into a first input terminal and an input signal introduced into second input terminal, and that generates output pulses according to the phase difference;
    a charge pump that outputs electric current according to an output signal from the phase-frequency detector;
    a loop filter that attenuates a charge pump output of the charge pump;
    a voltage controlled oscillator in which the frequency of an oscillator output signal is controlled according to an output voltage of the loop filter;
    a programmable divider which divides the oscillator output signal from the voltage-controlled oscillator according to input division number data and feeds it back to the second input terminal of the phase-frequency detector;
    a first modulator that transforms an incoming baseband signal into an integer signal for specifying a division number and that sends the integer signal to a control terminal of the programmable divider;
    a second modulator which shapes the incoming baseband signal into a prescribed signal waveform and sends it to the voltage controlled oscillator; and
    a controller which adjusts a phase error between the first modulator and the second modulator.

2. The phase locked loop according to claim 1, wherein the charge pump and the controller are configured to change the loop bandwidth such that the loop bandwidth is broadened upon input of a signal to activate the phase locked loop, then convergence to a frequency occurs which depends on a constant representing a carrier frequency, and after a prescribed time, the loop bandwidth is narrowed.

3. The phase locked loop according to claim 1, wherein the first modulator further comprises:
    a multiplier which multiplies the baseband signal by a constant;
    a sigma delta circuit which carries out sigma delta modulation of output of the multiplier; and
    an adder which adds a constant representing a carrier frequency to the output of the sigma delta circuit.

4. The phase locked loop according to claim 1, wherein the first modulator further comprises:
    a digital filter which transforms the baseband signal into a prescribed signal waveform;
    a sigma delta circuit which carries out sigma delta modulation of the output of the digital filter; and
    an adder which adds a constant representing a carrier frequency to the output of the sigma delta circuit.

5. The phase locked loop according to claim 3, wherein the sigma delta circuit is a first order or second order sigma delta circuit.

6. The phase locked loop according to claim 3, wherein the sigma delta circuit comprises a plurality of sigma delta circuits.

7. The phase locked loop according to claim 1, wherein the first modulator comprises a multiplier that is structured to multiply the baseband signal by a constant;
    a delta modulation circuit that is structured to carry out delta modulation of the output of the multiplier; and
    an adder that is structured to add a constant representing a carrier frequency to the output of the delta modulation circuit.

8. The phase locked loop according to claim 1, wherein the first modulator further comprises:
    a digital filter which transforms the baseband signal into a prescribed signal waveform;
    a delta modulation circuit which carries out delta modulation of the output of the digital filter; and
    an adder which adds a constant representing a carrier frequency to the output of the delta modulation circuit.

9. A data transmission circuit comprising:
    a phase-frequency detector that detects a phase difference between a reference signal introduced into a first input terminal and an input signal introduced into second input terminal, and that generates output pulses according to the phase difference;
    a charge pump that outputs electric current according to an output signal from the phase-frequency detector;
    a loop filter that attenuates a charge pump output of the charge pump;
    a voltage controlled oscillator in which the frequency of an oscillator output signal is controlled according to an output voltage of the loop filter; and
    a programmable divider which divides the oscillator output signal from the voltage-controlled oscillator according to input division number data and feeds it back to the second input terminal of the phase-frequency detector,
    a first modulator that transforms an incoming baseband signal into an integer signal for specifying a division number and that sends the integer signal to a control terminal of the programmable divider;
    a second modulator which shapes the incoming baseband signal into a prescribed signal waveform and sends it to the voltage controlled oscillator;
    an amplifier which is connected with the oscillator output of the voltage controlled oscillator in the phase locked loop; and
    a control circuit structured to provide:
        a loop bandwidth control signal to change the loop bandwidth of the phase locked loop, wherein the charge pump output current is changed in response to the loop bandwidth control signal;
        an On/Off signal which turns on or off the amplifier; and
        a reference signal and a baseband signal for the phase locked loop,
    wherein the baseband signal incoming is amplified and outputted.

10. The data transmission circuit according to claim 9, wherein the first modulator is not operating when the loop bandwidth control signal indicates a wider loop bandwidth of the PLL, and after the loop bandwidth signal changes the charge pump output current to narrow the PLL loop bandwidth, the first modulator moves to an operation state and outputs the modulation signal according to the inputted baseband signal.

11. A method for providing a variable loop bandwidth phase locked loop comprising:
    transforming in a first modulator that has a sigma delta circuit a baseband signal into an integer signal for specifying a division number;
    sending the integer signal to a control terminal of a programmable divider;

shaping in a second modulator an incoming baseband signal into a prescribed signal waveform and that sends it to a voltage controlled oscillator;

sending an oscillation signal from the voltage controlled oscillator to the programmable divider;

providing a variable current charge pump which changes the loop bandwidth of the phase locked loop according to a control signal from a control circuit;

providing a phase-frequency detector for receiving a reference signal from a controller and the oscillator signal from the programmable divider; and adjusting a phase error between the first modulator and the second modulator.

12. The method for providing a variable loop bandwidth phase locked loop of claim 11 wherein the first modulator transforms a baseband signal into an integer signal for specifying a division number by:

multiplying in a multiplier a transmission pulse train by a constant;

transforming in the sigma delta circuit an output of the multiplier into a prescribed pulse train;

averaging in an averaging circuit an average of outputs from the sigma delta circuit in a given zone;

adding in an adder a constant representing a carrier frequency to the output of the averaging circuit; and outputting a division integer to the programmable divider.

13. The method for providing a variable loop bandwidth phase locked loop of claim 11 wherein the first modulator transforms a baseband signal into an integer signal for specifying a division number by:

attenuating in a digital filter the baseband signal to a prescribed waveform;

transforming in the sigma delta circuit an output of the multiplier into a prescribed pulse train;

averaging, in an averaging circuit, an average of outputs from the sigma delta circuit in a given zone;

adding in an adder a constant representing a carrier frequency to the output of the averaging circuit; and outputting a division integer to the programmable divider.

14. The method for providing a variable loop bandwidth phase locked loop of claim 11 wherein the first modulator transforms a baseband signal into an integer signal for specifying a division number by:

reading from a data table a transmission waveform which depends on the baseband signal;

introducing the transmission waveform into the sigma delta circuit;

transforming in a sigma delta circuit an output of the multiplier into a prescribed pulse train;

averaging in an averaging circuit an average of outputs from the sigma delta circuit in a given zone;

adding in an adder a constant representing a carrier frequency to the output of the averaging circuit; and outputting a division integer to the programmable divider.

15. The method for providing a variable loop bandwidth phase locked loop of claim 11 wherein the second modulator comprises a pulse shaping circuit.

16. The method for providing a variable loop bandwidth phase locked loop of claim 15 wherein the sigma delta circuit provided comprises a first order sigma delta circuit for:

inputting an input signal x(n) which is output from the multiplier; and outputting the integer signal from a quantizer which outputs an integer closest to a value of the input signal to an adder and to a delay circuit wherein the delay circuit adjusts a phase difference to eliminate phase error between the pulse shaping circuit and the adder.

17. The method for providing a variable loop bandwidth phase locked loop of claim 15 wherein the sigma delta circuit provided comprises a second order sigma delta circuit for:

inputting an input signal x(n) which is output from the multiplier;

outputting the integer signal from a quantizer which outputs an integer closest to a value of the input signal to an adder and to a delay circuit and a multiplier;

wherein the delay circuit adjusts a phase difference to eliminate phase error between the pulse shaping circuit and the adder;

and wherein a multiplier multiplies the output of the delay circuit by a constant.

18. The method for providing a variable loop bandwidth phase locked loop of claim 15 wherein the sigma delta circuit provided comprises:

using a plurality of stable sigma delta circuits which are lower than the second order level to make up a second order or higher-level multi-stage sigma delta circuit to assure stable operation.

19. A method for providing a variable loop bandwidth phase locked loop comprising:

multiplying in a multiplier a baseband signal by a constant;

transforming in a first modulator that has a sigma delta circuit the output of the multiplier into an integer signal for specifying a division number;

sending the integer signal to a control terminal of a programmable divider;

shaping in a second modulator an incoming baseband signal into a prescribed signal waveform and that sends it to a voltage controlled oscillator;

sending an oscillation signal from the voltage controlled oscillator to the programmable divider;

providing a variable current charge pump which changes the ioop bandwidth of the phase locked loop according to a control signal from a control circuit;

providing a phase-frequency detector for receiving a reference signal from a controller and the oscillator signal from the programmable divider; and inputting at an input of the multiplier a succession of "1" or "0" based on the baseband signal, wherein the reference signal frequency is higher than the symbol rate, the sampling frequencies of the phase-frequency detector and the sigma delta circuit; and adjusting a phase error between the first modulator and the second modulator.

* * * * *